(12) United States Patent
Hwang et al.

(10) Patent No.: US 6,312,855 B1
(45) Date of Patent: Nov. 6, 2001

(54) THREE-PHASE PHASE SHIFT MASK

(75) Inventors: Jiunn-Ren Hwang, Hsinchu; I-Hsiung Huang, Kaohsiung; Anseime Chen, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/444,466

(22) Filed: Nov. 22, 1999

(51) Int. Cl.[7] ........................................ G03F 9/00
(52) U.S. Cl. ............................................... 430/5
(58) Field of Search .................. 430/5, 322; 716/19, 716/20, 21

(56) References Cited

U.S. PATENT DOCUMENTS 5,900,338 * 5/1999 Garza et al. ............................ 430/5

* cited by examiner

Primary Examiner—S. Rosasco
(74) Attorney, Agent, or Firm—Thomas, Kayden, Horstemeyer & Risley, LLP

(57) ABSTRACT

A three-phase phase shift mask. On a transparent substrate, a non-transparent pattern covering a portion of the transparent substrate is formed, while the other portion of the substrate is remained exposed. A proximity region around a corner of the non-transparent pattern is equally partitioned three phase-shift areas different from each other with a phase shift of 120°. The formation of these three phase-shift areas uses two etching steps to form a first and a second phase-shift areas, while a portion of the exposed substrate is etched twice as a third phase-shift area.

11 Claims, 27 Drawing Sheets

(18 of 27 Drawing Sheet(s) Filed in Color)

120° Etching Area      Masking Area

THREE-PHASE PHASE SHIFT MASK

BACKGROUND OF THE INVENTION

1. Field of the Invention

The invention relates in general to a method of a phase shift mask. More particularly, the invention relates to a three-phase phase shift mask to resolve the corner round problem occurred in an unexposed edge area caused by diffraction or scattering of light.

2. Description of the Related Art

As the integration of an integrated circuit is demanded higher and higher, the design is developed toward a direction of further shrinking the devices and the circuit. The photolithography technique plays one of the most important roles for the shrinkage. For examples, the sizes of any structures related to a metal-oxide semiconductor (MOS) such as a thin film pattern and the dopant area are basically determined by this technique. Thus, whether the integration of semiconductor industry can be further developed down to, over even under, a linewidth of 0.15 micron, is determined by the development of photolithography technique. According to the great demand, methods to enhance the resolution of photomask such as using optical proximity correction (OPC) and phase shift mask (PSM) have been proposed.

The method of optical proximity correction is to eliminate the deviation in critical dimension (CD) caused by the proximity effect. When a light beam is incident on a wafer through the pattern of a photomask, the light beam is scattered so that the area of the wafer spotted by the light is enlarged. On the other hand, the light beam may be reflected from the semiconductor substrate of the wafer to cause an interference with the incident light beam. As a result, a double exposure is caused to change the exposure degree of the wafer. The proximity effect is even more obvious when the critical dimension is close to the wavelength of the incident light.

Referring to FIG. 1A to 1D, a conventional method of optical proximity correction is drawn. In FIG. 1A, a photomask 100 having a pattern of three rectangular masking areas are shown and denoted as 105, while the rest area of the photomask is transparent and denoted as 110. The substrate material of the photomask 100 is typically glass or quartz that forms the transparent area 110. The masking areas 105 are typically made of a layer of chromium (Cr). In FIG. 1B, when a light beam is incident on the photomask 100, a wafer substrate 120 underneath would have three dark regions 125 and a light regions 130 on a substrate 120.

As shown in FIGS. 1A and 1B, the masking areas 105 are in rectangular shape, however, the pattern transferred onto the wafer substrate 120 becomes dark regions 125 with rounded corners and smaller dimensions. Patterns or masking areas in other region that is not shown in this figure may be distorted or deformed in other form. For example, when the mask regions of the pattern are designed close to each other, after exposure, the patterns transformed into the wafer substrate might merge with each other or deviate from the original pattern.

In general practice, to compensate the above deformation of patter, at the corners or edge of the masking areas 105, assistant features such as serifs 150 and 155 at the corners and along the edge as shown in FIG. 1C. the serifs 150 at the corners are added to resolve the problem of rounded corner, while the serifs 155 along the edge are added to restore the desired dimensions of the pattern. As shown in FIG. 1D, using this method, the fidelity of the pattern transferred from the photomask 100 to the wafer substrate 120 is very much improved. The dark areas 125a has a much less rounded corners, while the dimensions of these areas 125a are closer to those 105 on the photomask 100.

However, when the distance between patterns is further reduced or the critical dimension of is further shrunk to lower than 0.1 microns, this method meets its bottleneck. That is, using this method for compensation or amendment of the patterns, the available spaces or areas for forming or adding the assistant feature such as serifs are too small.

SUMMARY OF THE INVENTION

The invention provides a three-phase phase shift mask. A transparent substrate is provided. A non-transparent pattern covering a first portion of the transparent substrate is formed, while a second portion of the substrate remains transparent. The three phase-shift areas are on the second portion of the substrate, these three phase-shift area are different from each other with a phase shift of 120°. At any corner of the non-transparent pattern, a proximity region around the corner is equally partitioned by the three phase-shift areas. Apart from the proximity region, the second portion of the transparent substrate comprises only phase edges between two phase-shift areas instead of three.

The three-phase phase shift mask provides an effect of eliminating deformation such as a corner rounding effect of the transferred pattern. This is because at each corner of the pattern on the photomask, an incident light is split into three light beams transmitting through these three phase shift areas. Since the phase shift of these three phase shift regions are different from each with a phase shift of 120°. As a total, the sum of these three light beams straying into the corner is zero. As a result, the diffraction, scattering or even interference at the corner pattern on the wafer is eliminated. The fidelity of the transferred pattern is thus enhanced. In addition, on other parts of the transparent photomask, edge phases are formed between two phase shift areas only. It has been mentioned that any two of the three phase shift areas are different in phase shift of 120°, therefore, even at the phase edges, the light cannot be cancelled totally. There is no worry for forming any unwanted dark area on the wafer.

The method of fabricating the three-phase phase shift mask is also provided in the invention. In the three-phase phase shift mask, three phase shift areas are formed in two etching steps. Some portions of the transparent substrate other than the non-transparent pattern formed thereon is etched twice to for the third phase shift area.

Both the foregoing general description and the following detailed description are exemplary and explanatory only and are not restrictive of the invention, as claimed.

BRIEF DESCRIPTION OF THE DRAWINGS

The file of this patent contains more than one drawings executed in color. Copies of this patent with color drawings will be provided by the Patent and Trademark Office upon request and payment of the necessary fee.

DESCRIPTION OF THE PREFERRED EMBODIMENTS

Figure 1A:
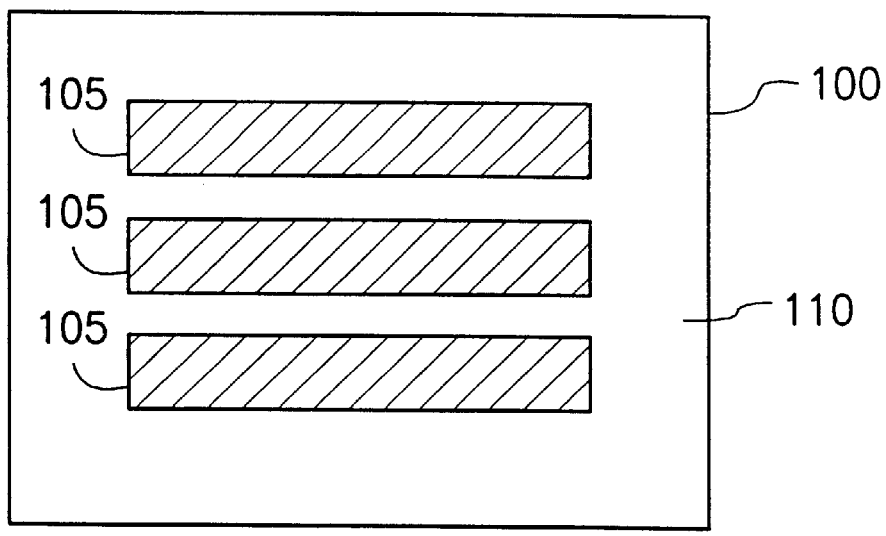
FIG. 1A to FIG. 1D show a conventional method of optical proximity correction.
Figure 1B:
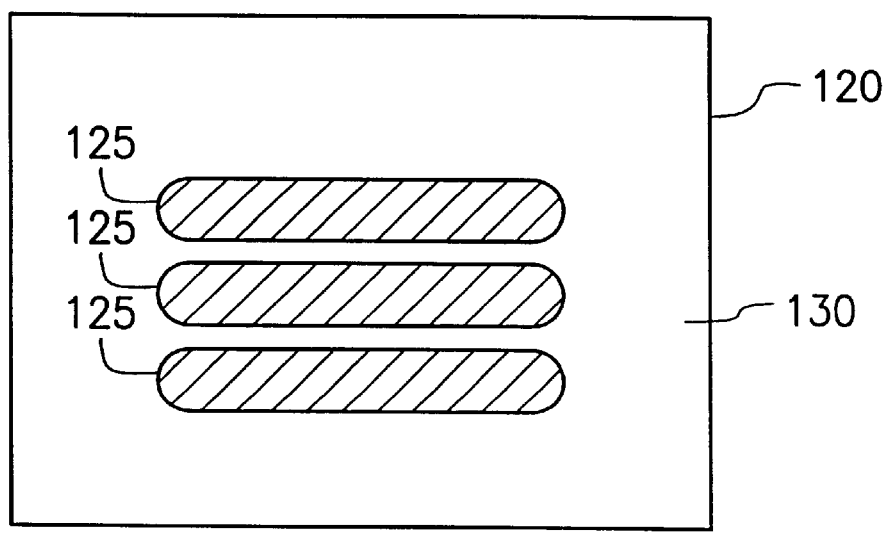
Figure 1C:
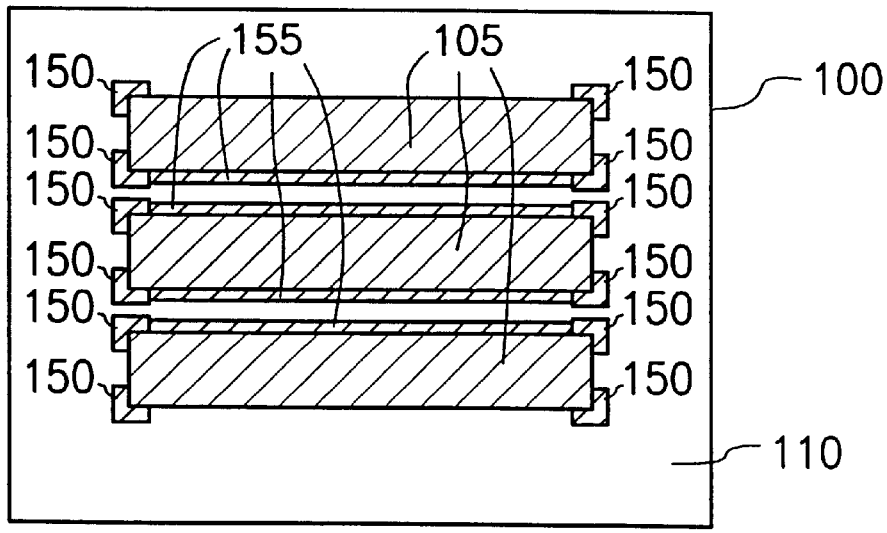
Figure 1D:
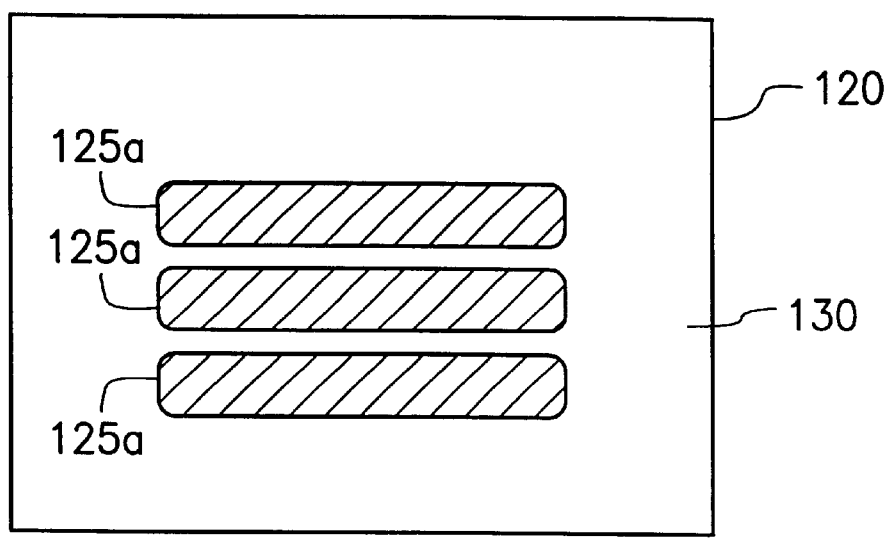
Figure 2A:
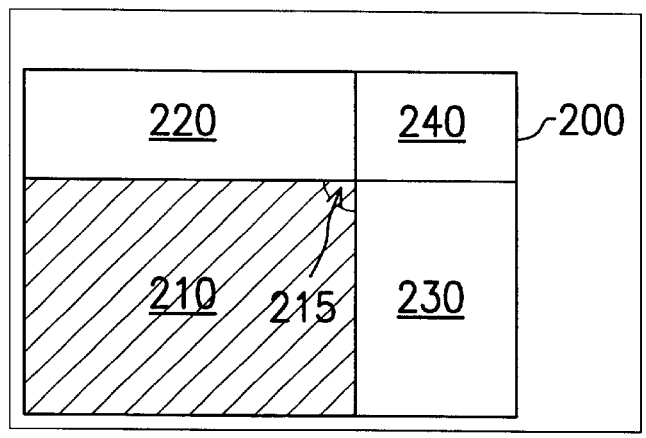
FIG. 2A shows a top view of a portion of a three-phase phase shift mask provided by an embodiment of the invention.

In FIG. 2A, a pattern 210 with a corner 215 on a photomask 200 is shown. The pattern 210 is made of material such as chromium which blocks the incident light to go through. That is, the pattern 210 is in a form of non-transparent masking area, while the rest portion of the photomask 200 is transparent area made of, for example, glass or quartz. The proximity area around the corner 215 is partitioned into three phase-shift areas 220, 230 and 240. Assuming that the corner 215 has an angle of a°, each of the three phase-shift areas 220, 230 and 240 are partitioned with each other to share the thus has an angle of (360−a°)/3 degree at the joint of the angle 215.

Figure 2B:
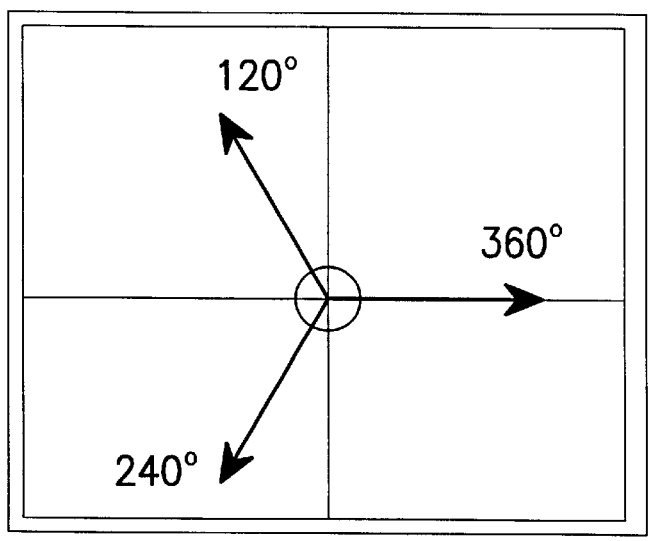
FIG. 2B shows the vectors of light beams transmitting through the proximity region around the corner of the pattern on the phase shift mask shown in FIG. 2A.
Figure 2C:
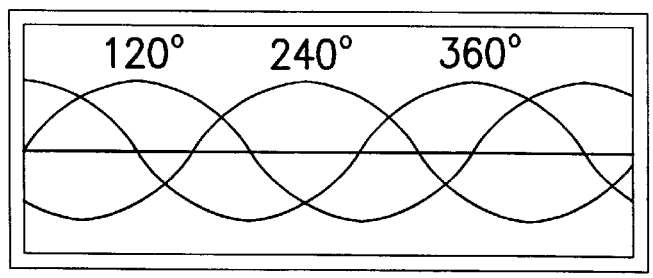
FIG. 2C shows the light waves of the three light beams as shown in FIG. 2B and the sum of the three beams which is totally cancelled.

By etching the transparent areas of the photomask 200, the phase of light incident upon these areas can be changed with respect to the thickness of these areas. In this embodiment, the phase shift-areas 220 and 240 are etched to result in a phase of 120°, that is, 2/3π. After etching the areas 220 and 240, the areas 240 and 230 are etched to shift with a phase of 240°, that is, 4/3π. As a result, the area 240 has been etched twice to result in a total phase shift of 360° equivalent to zero degree, that is, 2π. The phase difference for these three phase-shift areas 220, 230 and 240 are thus 2/3π from each other. Referring to FIG. 2B, when a light is incident on the photomask 200, the light scattering into the corner 215 is thus consisting of three light beams from the three phase-shift areas 220, 230 and 240. The vector of these three light beams are shown as FIG. 2, while the amplitude of these three light beams at any moment in time are shown as FIG. 2C. From both FIG. 2 and FIG. 3, it can be easily realized that these three light beams are cancelled. As a consequence, at the corner 215, the light beam is cancelled after being split. That is, during exposure, there is no light shone at the corner 215. The effect of adding an assist feature around the corner to improve the fidelity of transferred pattern in the conventional method is achieved without materially adding any feature.

Figure 3A:
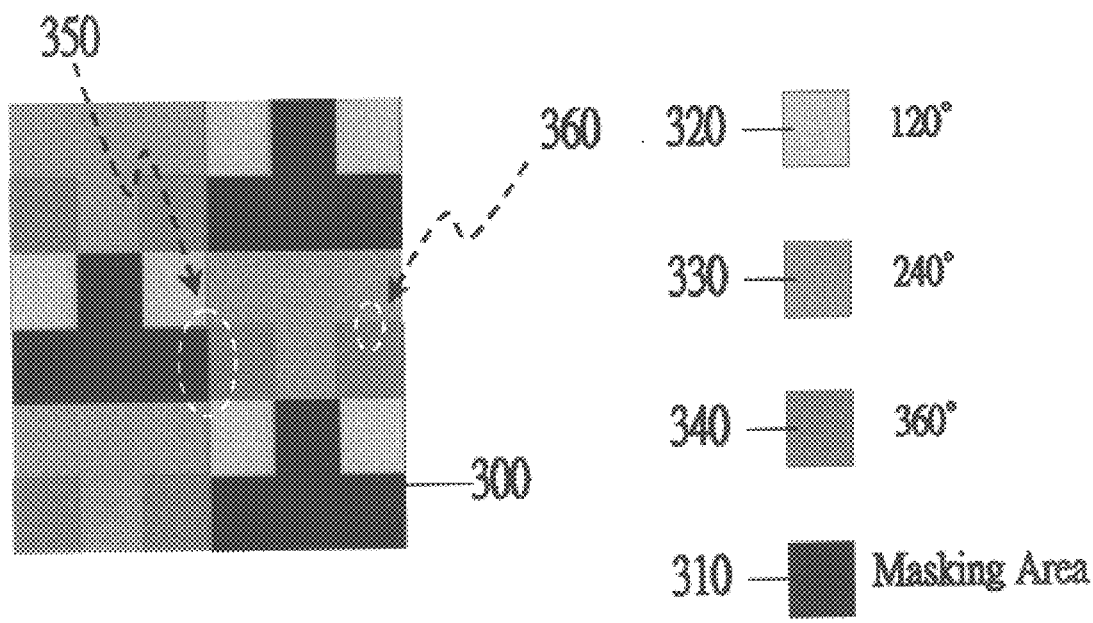
FIG. 3A shows an overall pattern formed on a three-phase phase shift mask.
Figure 3B:
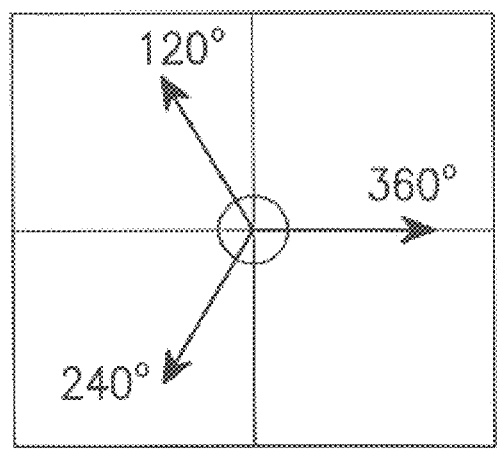
FIG. 3B shows the vectors of the three light beams transmitting through a proximity region around a corner of a pattern of the phase shift mask.

The above has described the partitioning steps among the proximity area around the corner 215 to eliminate the deformation of the corner. However, the overall pattern on the photomask 200 is not considered yet. Please refer to FIG. 3A, a colored drawing of the overall pattern 310 of the photomask 300 is illustrated. To eliminate the deformation such as the rounding effect around each corner of the pattern 310 on the photomask 300, the proximity area around each corner is partitioned into three phase-shift areas represented by three different colors. In FIG. 3A, the pinkish area 320 has a phase shift of 120°, the blue area 330 has a phase shift of 240°, the green area 340 has a phase shift of 360°, and the black area are the pattern made of non-transparent material such as chromium. When a light is shone onto the photomask 300, again, at each corner of the pattern 310, the light is split into three light beams in these three areas 320, 330 and 340 respectively. Again, through these three areas 320, 330 and 340, these three light beams have the phase shifts of 120°, 240°, and 360°, respectively. The vectors of these three light beams are illustrated as FIG. 3B. As a result, the sum of these three light beams is equal to zero, and the light incident upon proximity area around each corner is cancelled to avoid the diffraction, interference or scattering. The problem of deformation such as rounding effect at each corner is thus resolved. In addition to the corner portions, these three phase shift areas 320, 330 and 340 extends towards other transparent parts on the photomask 300. As shown in FIG. 3A, phase edges are formed in the transparent region of the photomask 300 other than the proximity area of each corner. For example, the areas comprise the blue area 330 and the pink 230 with a phase edge circled as 360, the areas comprise the pinkish area 320 and the blue area 330, or the areas comprise the blue area 330 and the green area 340. Each side of the pattern 310 is adjacent to one of the phase shift areas 320, 330 and 340, as shown in FIG. 3A, the edge of one green area 340 adjacent to a side of the pattern is circled as 350.

Figure 3C:
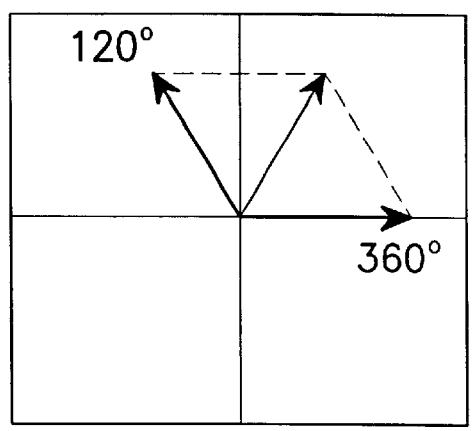
FIG. 3C to FIG. 3E shows the vectors of light beams passing through phase edges between any two of the three phase shift areas and the sum of any two beams with a non-zero amplitude.
Figure 3D:
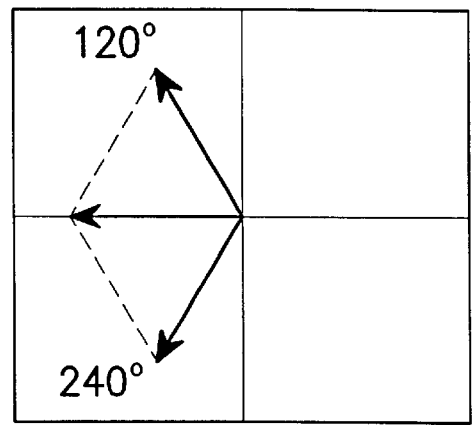
Figure 3E:
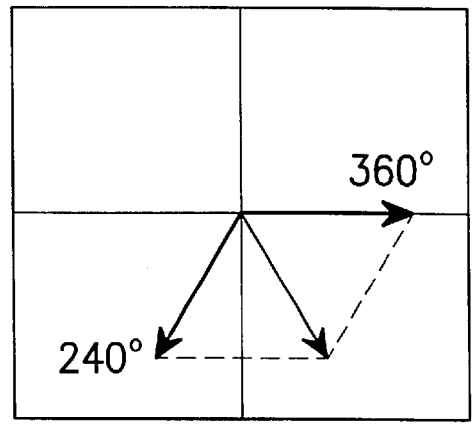

FIG. 3C shows the sum of the vectors of light beams transmitting through the phase edge between the pinkish area 320 and the green area 340. FIG. 3D shows the sum of the vectors of light beams passing through the phase edge of the pinkish area 320 and the blue area 330. FIG. 3E shows the sum of the vectors of light beams passing through the phase edge of blue area 330 adjacent to the green area 340. From FIG. 3C to FIG. 3D, at each phase edge, unlike those phase edges between phase-shift areas complementary to each other, for example, between a 0° area and a 180° area, there is no worry that the light beams may cancel with each other since the phase difference is 120°. The sum of two beams has an amplitude the same as the original two beams with a phase between these two beams. Therefore, using the three-phase phase shift mask does not only overcome the problems of corner deformation, but also has the advantage of avoiding phase edge effect such as forming an unwanted dark strip of pattern on the wafer after exposure.

Figure 4A:
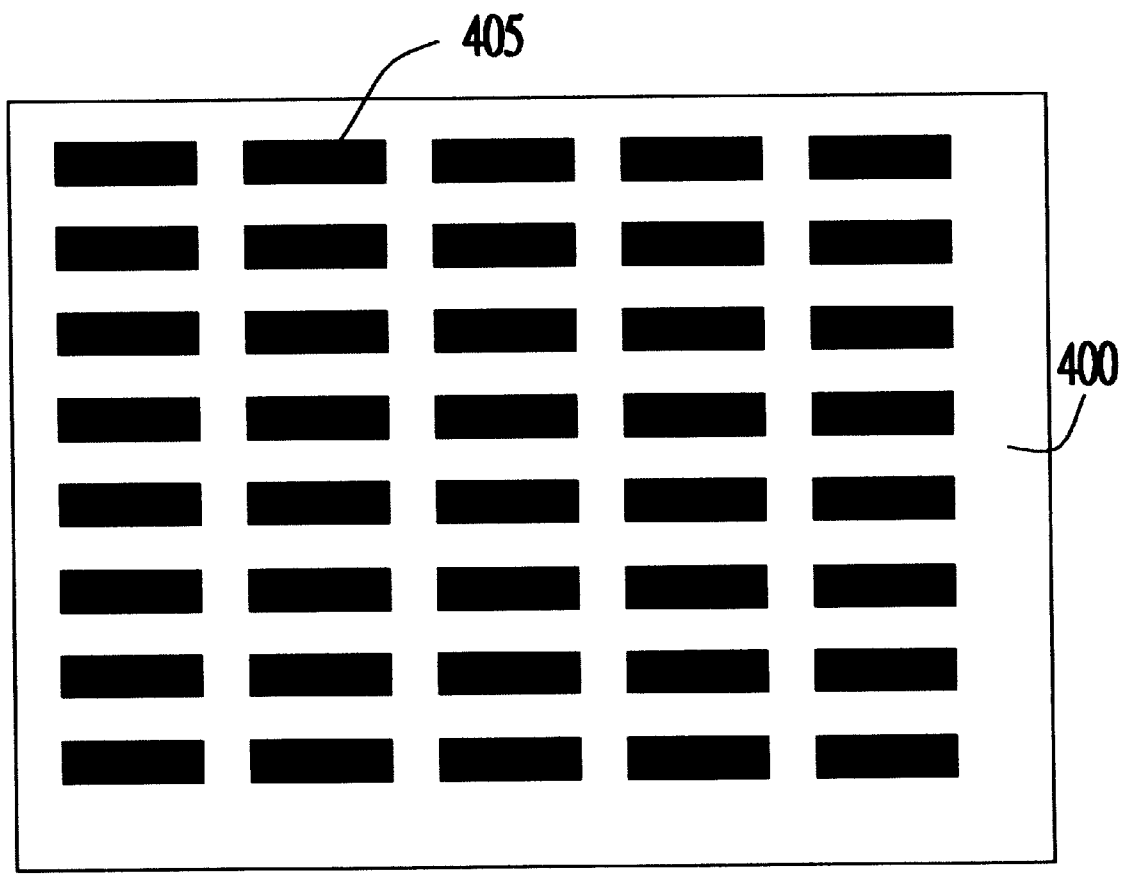
FIG. 4A shows a pattern to be formed on a photomask.

As mentioned above, the phase-shift areas can be formed using etching the transparent area of the photomask substrate in different thickness. The transparent area with different thickness thus changes the optical path the incident light beam passing through. That is, these three phase-shift areas have different thickness. FIG. 4A illustrates an example of photomask 400 for forming an array of rectangular patterns 405. The method for forming a three-phase phase shift mask at each corner of each rectangular pattern 405 is illustrated as FIG. 4B to FIG. 4D.

Figure 4B:
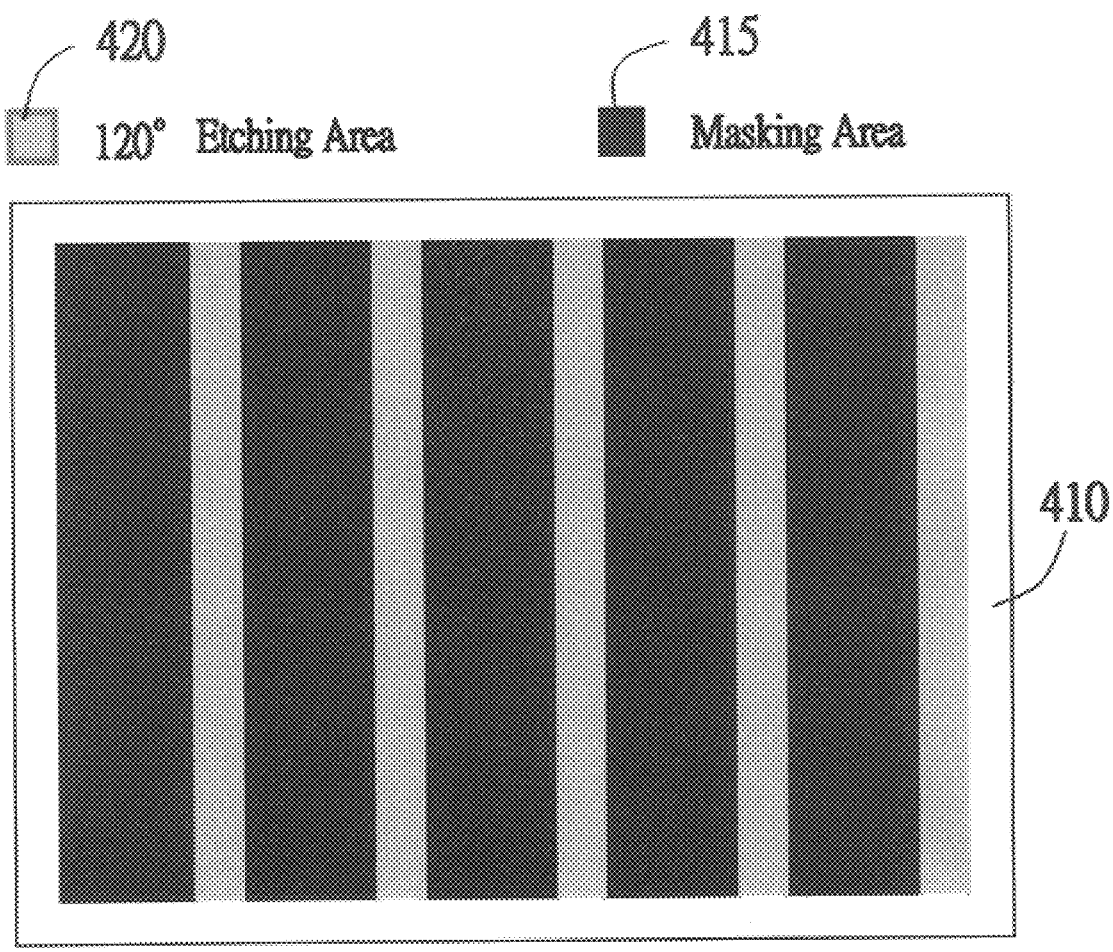
FIG. 4B and FIG. 4C show two etching steps, respectively.
Figure 4C:
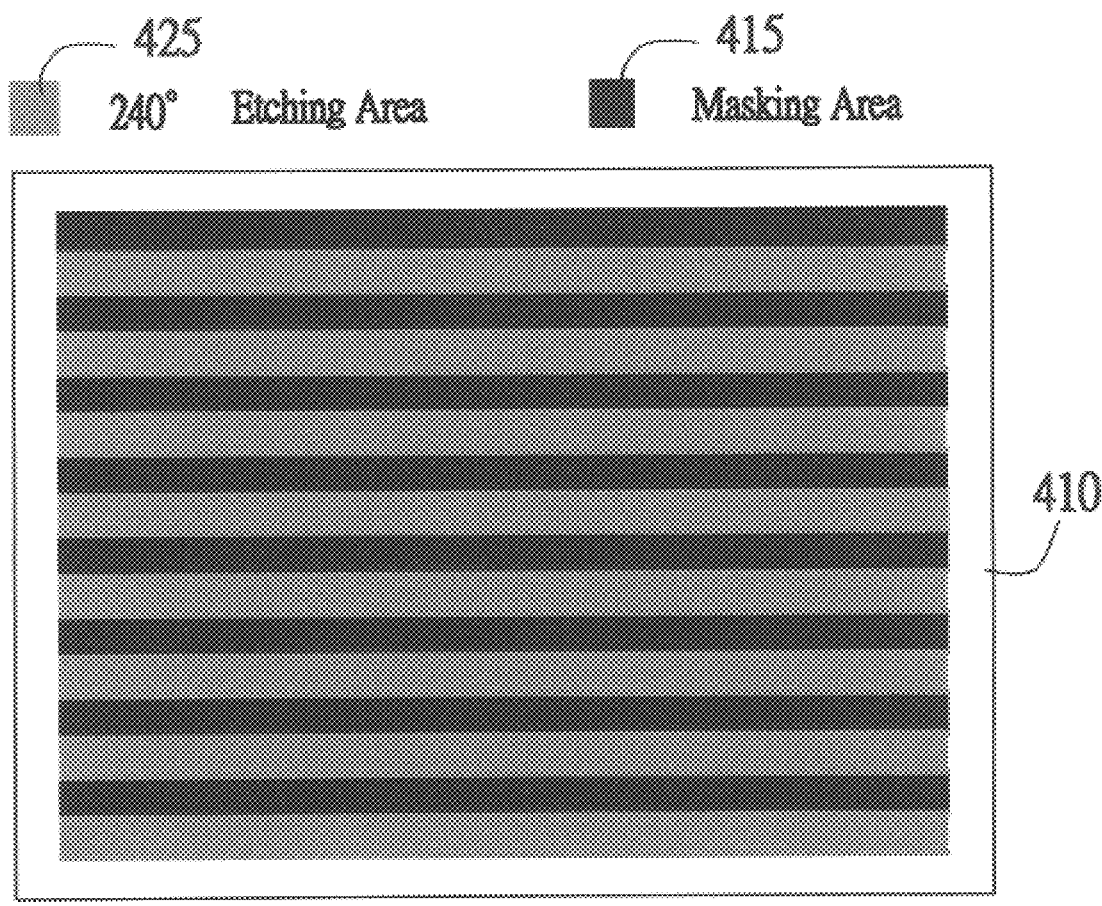
Figure 4D:
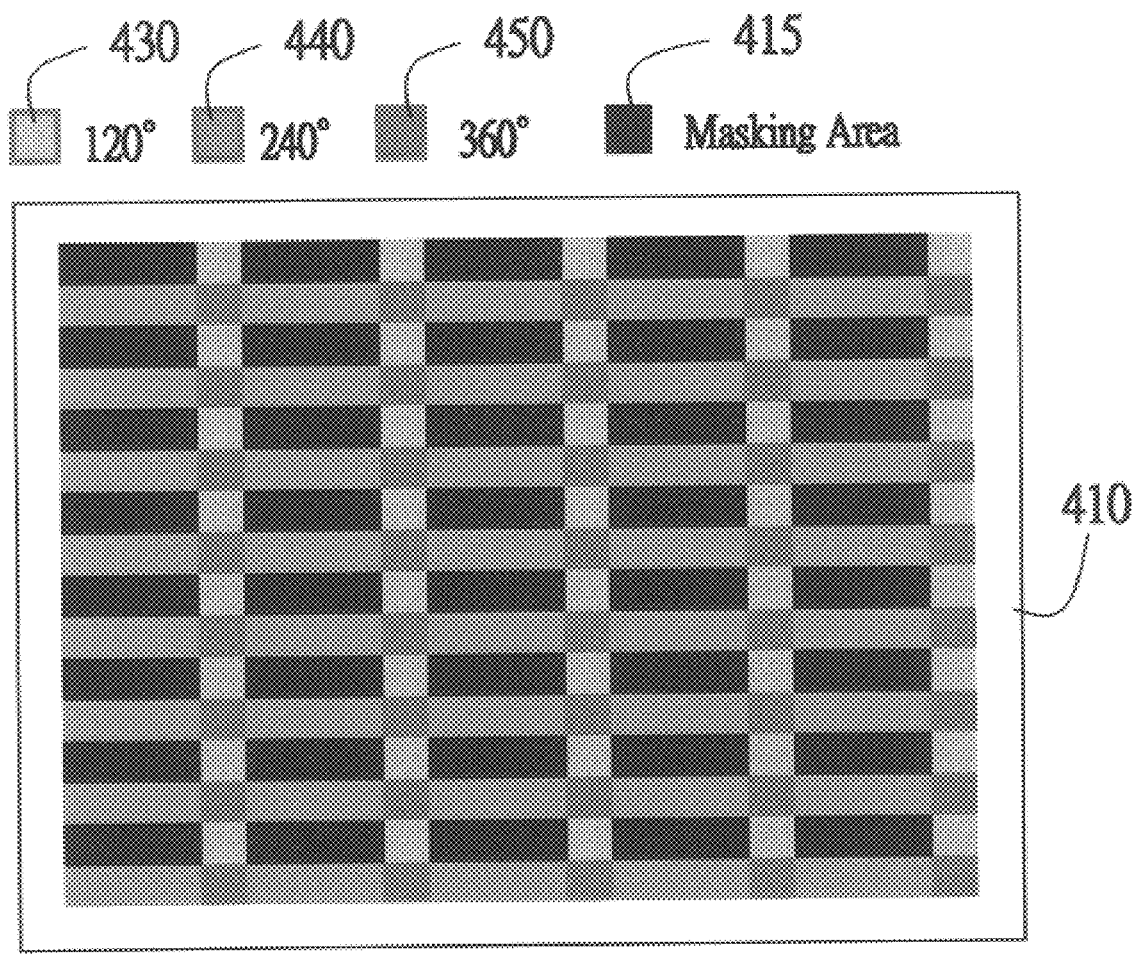
FIG. 4D shows the pattern as shown in FIG. 4A with a three-phase phaseshift characteristics by superposing the patterns shown as FIG. 4B and FIG. 4C.

In FIG. 4B, a photomask 410 is etched once to form the non-transparent pattern of black areas, for example, the rectangular blocks 415. The non-transparent areas 415 are typically made of chromium, while the areas drawn in pinkish color denoted by the reference numeral 420 are the transparent phase-shift areas with a phase of 120°. FIG. 4C shows the photomask 410 being etched once to form a pattern with non-transparent strip-like areas 415, while transparent areas drawn with blue color are formed as the phase shift areas 425 with a phase of 240° in the same step. In FIG. 4D, the photomask 410 that has been etched to form both the phase-shift areas of 120° and 240° is shown. Again, the non-transparent strip-like areas 415 are typically made of chromium, and the transparent region are typically made of glass or quartz. As shown in FIG. 4D, the transparent region that has been etched twice is drawn with green color and this region is the phase shift area 450 with a phase of 120°+240°=360°. In this manner, a photomask 410 with an array of rectangular patterns 415 and each corner of the rectangular patterns has a proximity area equally partitioned into three phase shift areas 430, 440 and 450 are shown in FIG. 4D.

Figure 5:
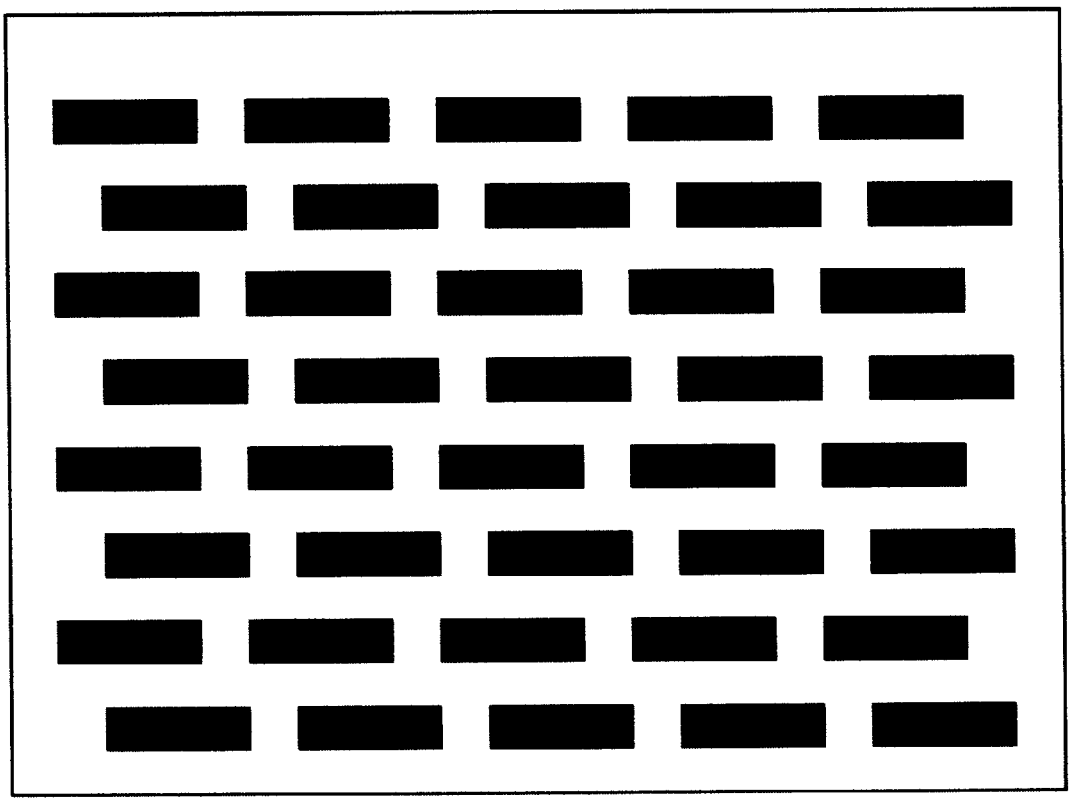
FIG. 5 shows a pattern to be formed on a photomask.
Figure 6A:
FIG. 6A to FIG. 6C show different patterns formed after a first etching step, respectively.
Figure 6A:
Figure 6A:
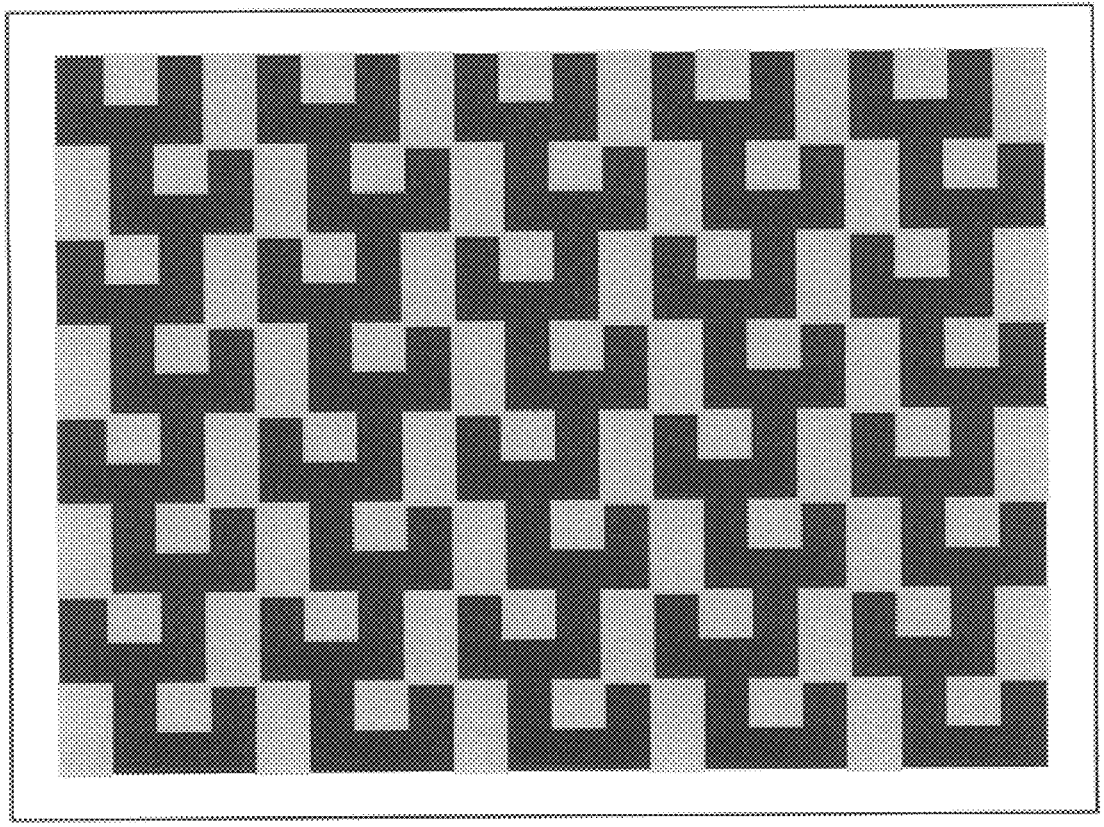
Figure 6B:
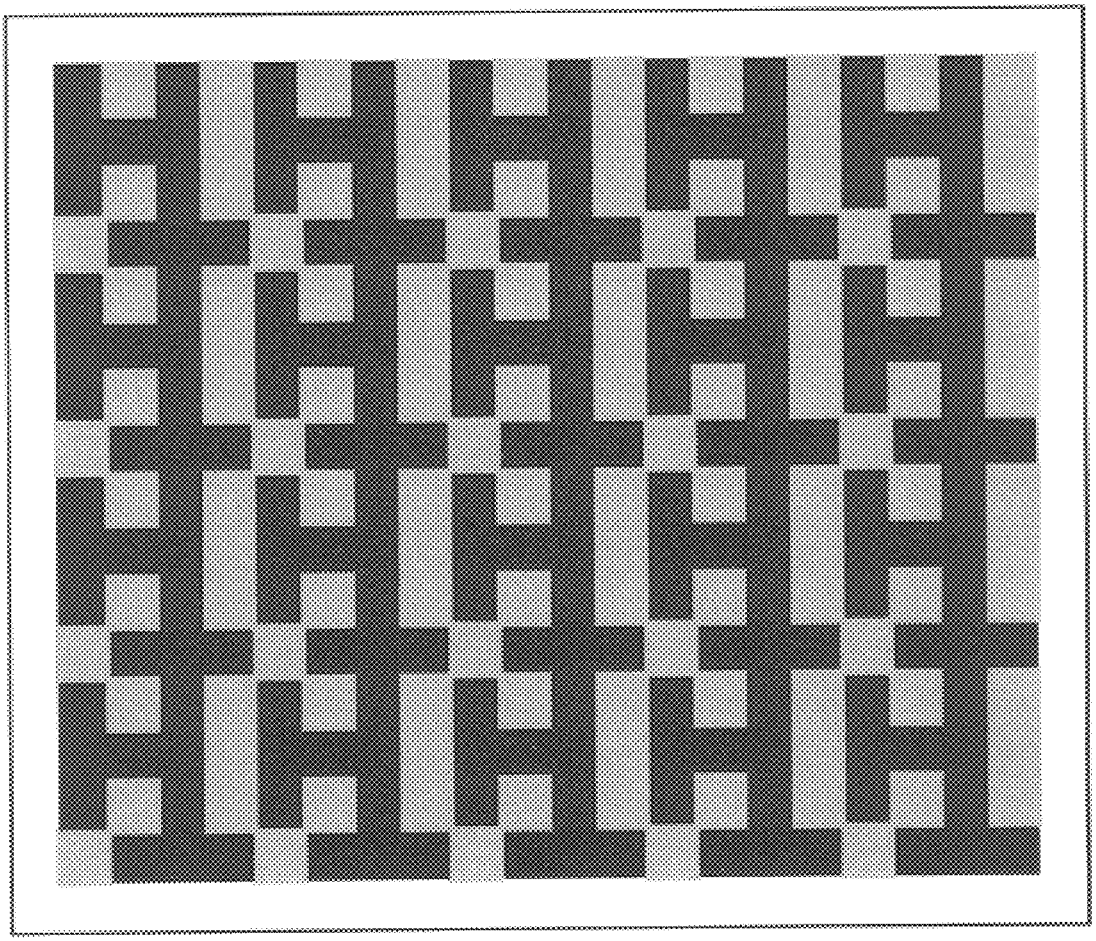
Figure 6C:
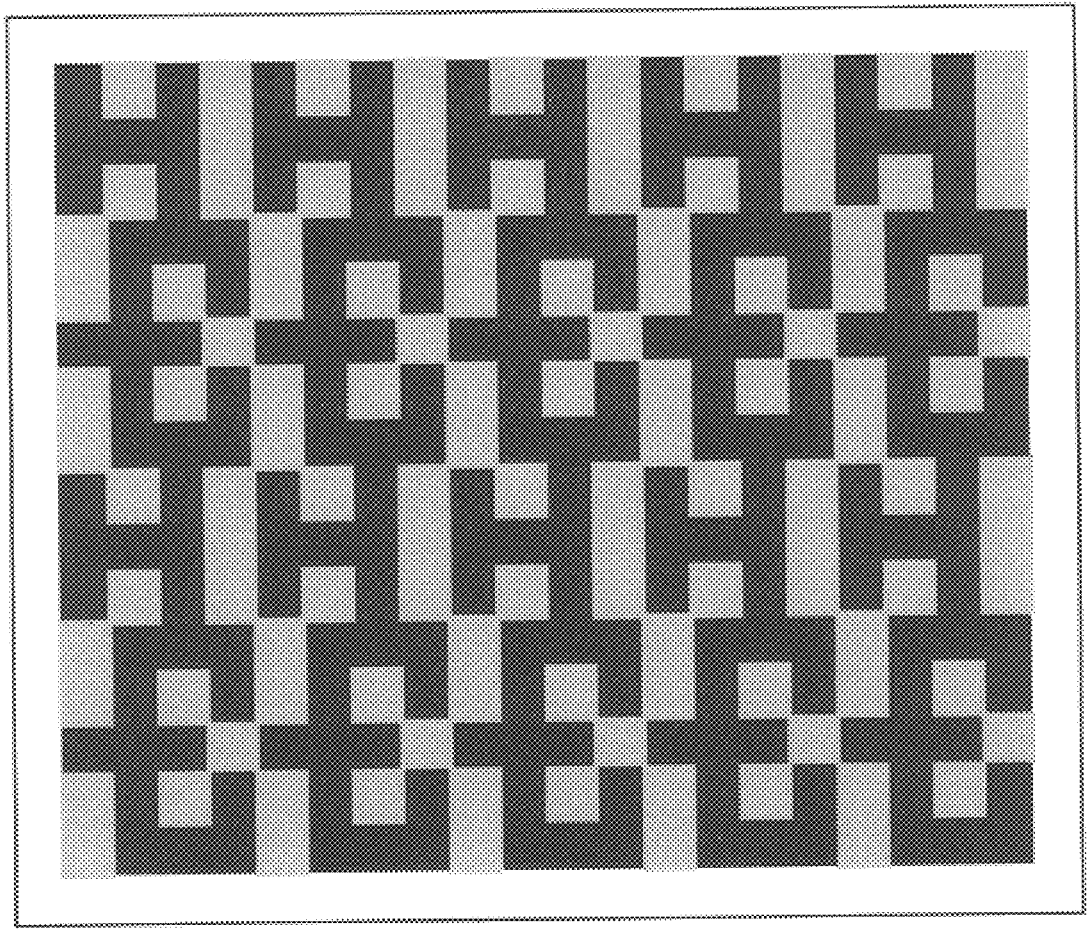
Figure 7:
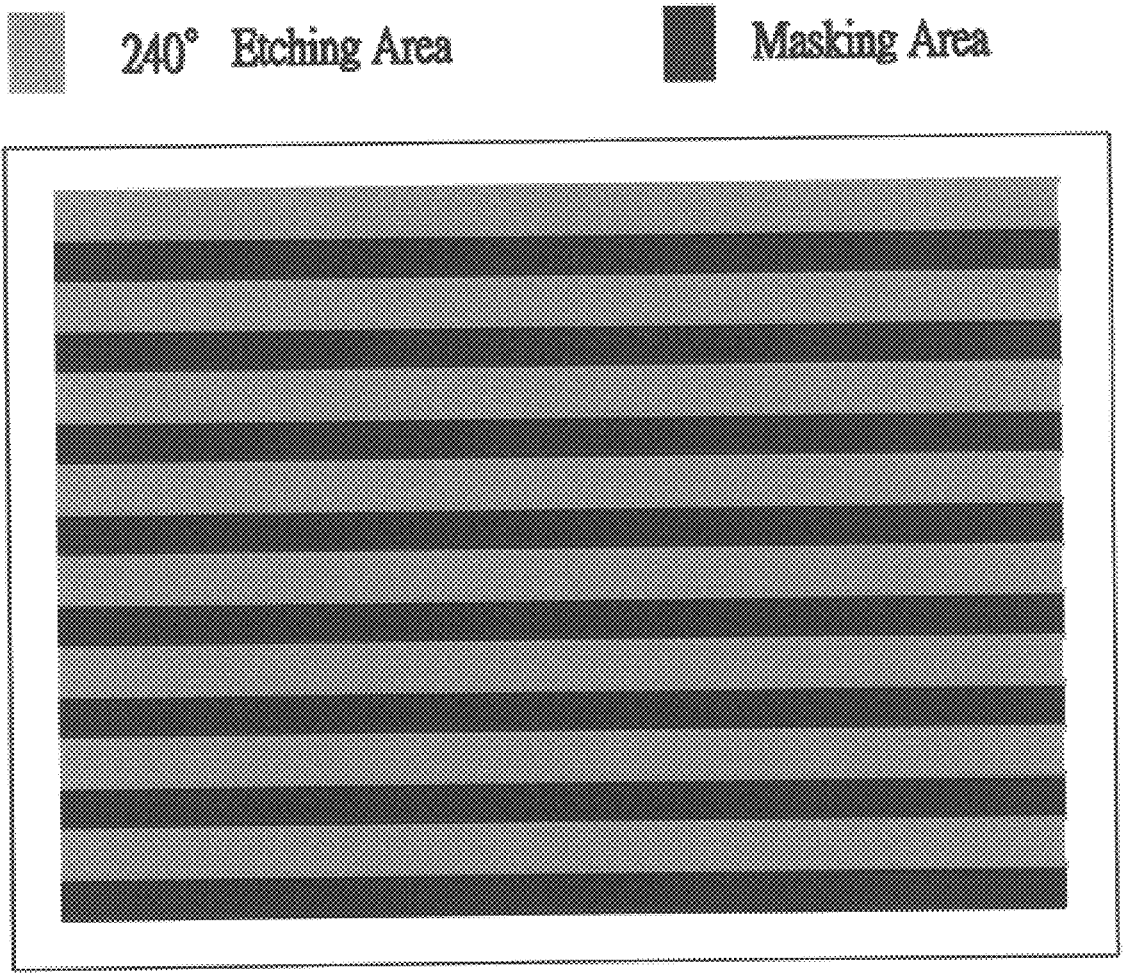
FIG. 7 shows a pattern of the a second etching step.
Figure 8A:
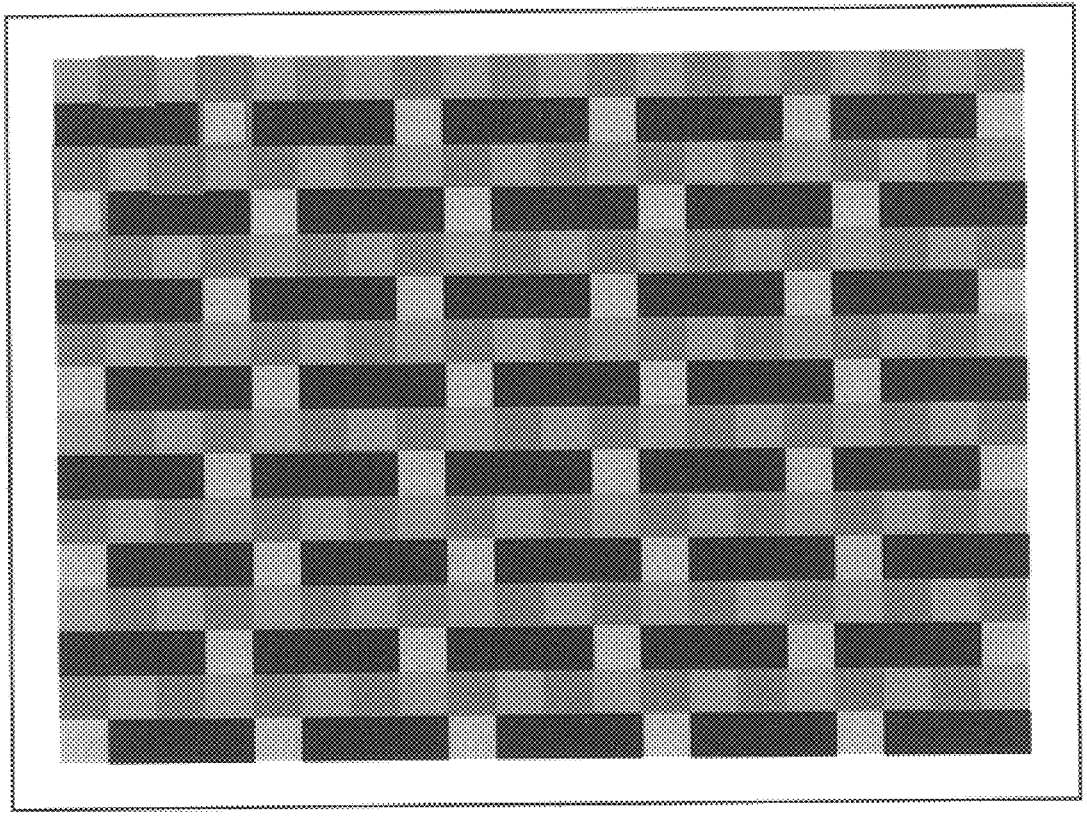
FIG. 8A to FIG. 8C show a pattern as shown in FIG. 5 with a three-phase phase-shift characteristics by superposing the patterns shown as FIG. 6A to FIG. 6C with the pattern in FIG. 7, respectively.
Figure 8B:
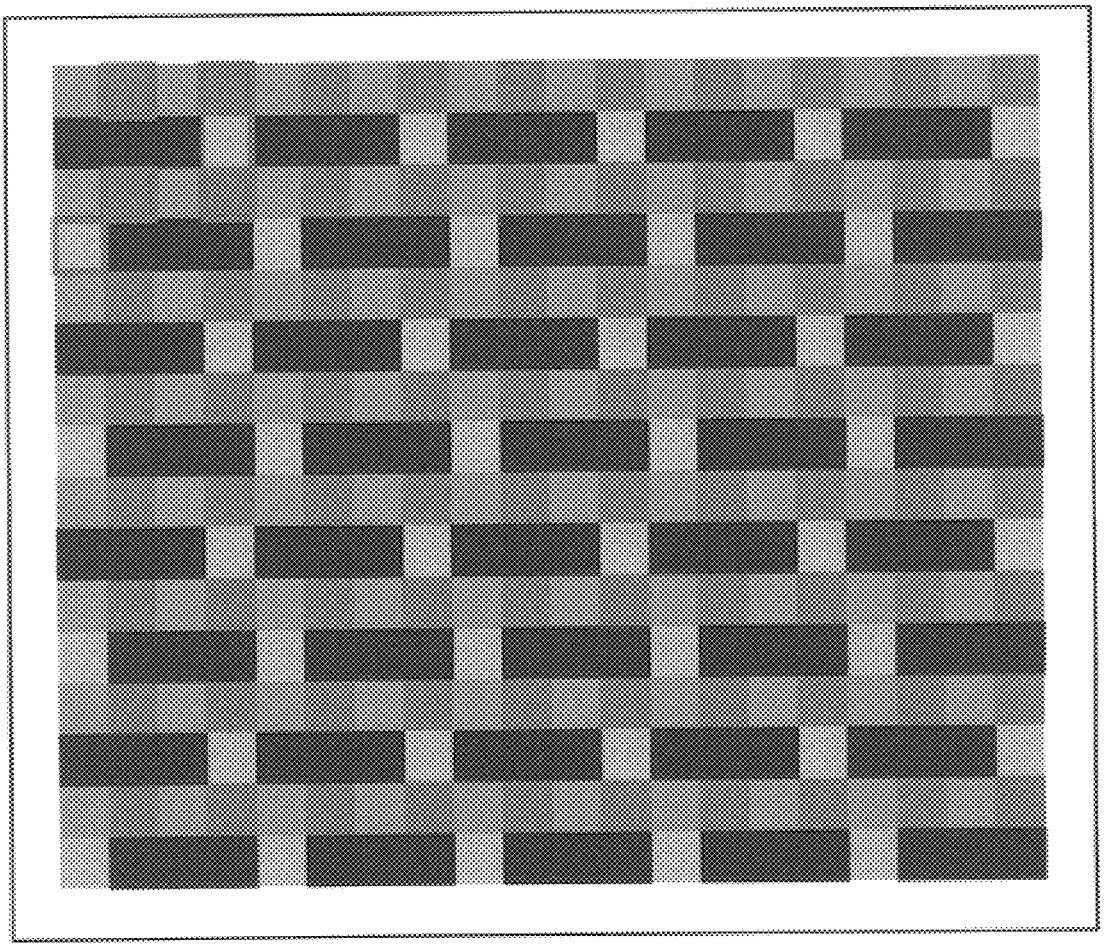
Figure 8C:
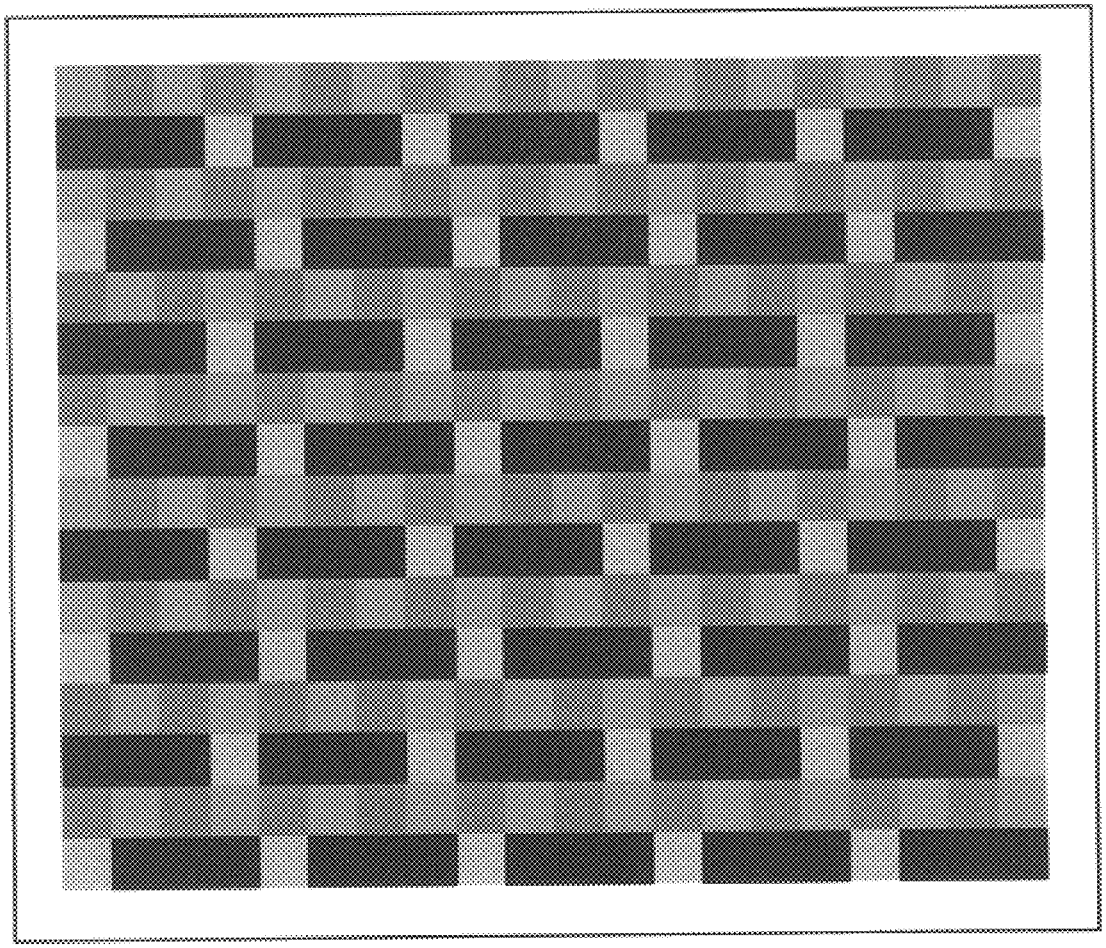

FIG. 5 shows the embodiment of fabricating three-phase phase shift mask with different patterns. In FIG. 5, a pattern with staggered rectangular blacks made of non-transparent material such as chromium is shown. Similarly, two etching steps to respectively etch a first phase shift area with a phase of 120° as the pinkish areas in FIG. 6A, FIG. 6B or FIG. 6C and a second phase shift area with a phase of 240° as the blue areas in FIG. 7 are performed. As a result, an another phase shift area with a phase of 360° is formed since this area is an overlapping area that has been etched twice. FIG. 8A shows the three-phase phase shift mask 410 with a pattern of staggered rectangular non-transparent areas as a superposition of both FIG. 6A and FIG. 7, while FIG. 8B and FIG. 8C are superposition of FIG. 6B and FIG. 7, and FIG. 6C and FIG. 7, respectively. The proximity region around each corner of the pattern is equally partitioned into three phase shift areas as shown in FIG. 8A, FIG. 8B and FIG. 8C, so that the proximity region of each corner is not exposed to eliminate the problem of deformation.

Figure 9:
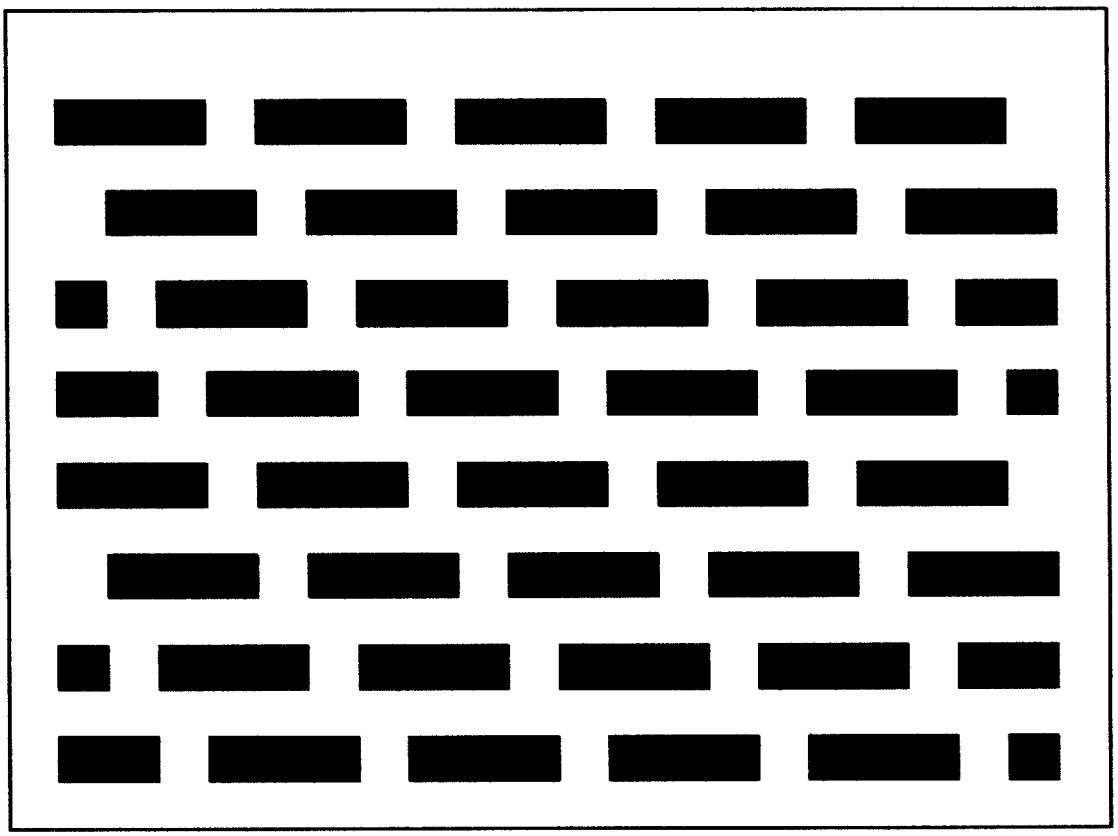
FIG. 9 shows a pattern to be formed on a photomask.
Figure 10A:
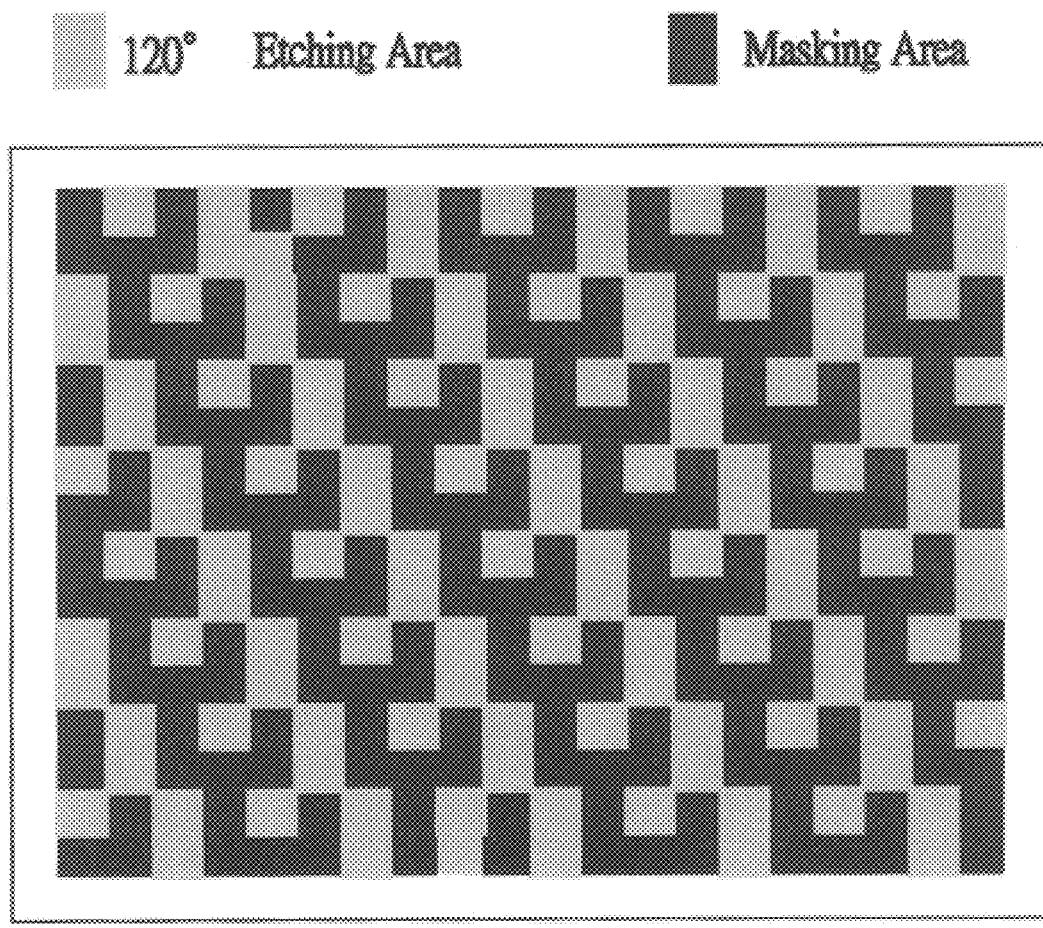
FIG. 10A and FIG. 10B show different patterns formed after a first etching step, respectively.
Figure 10B:
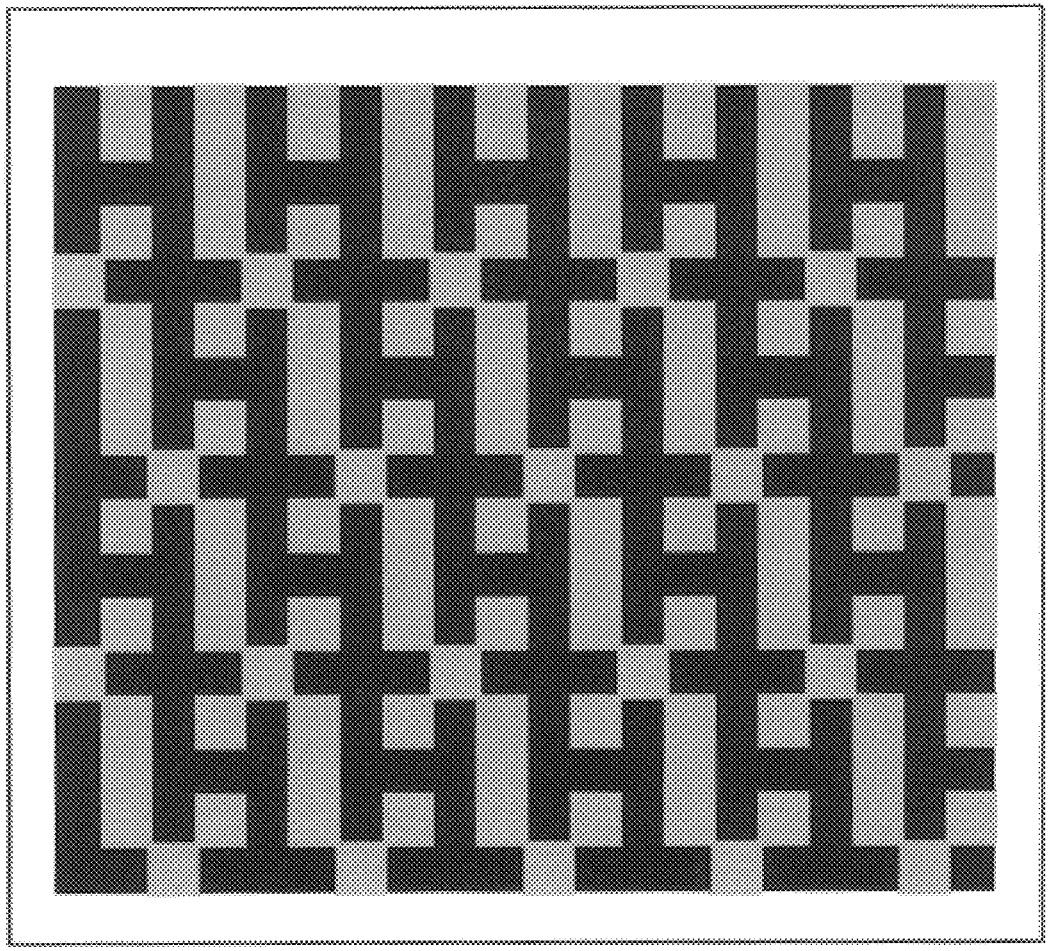
Figure 11:
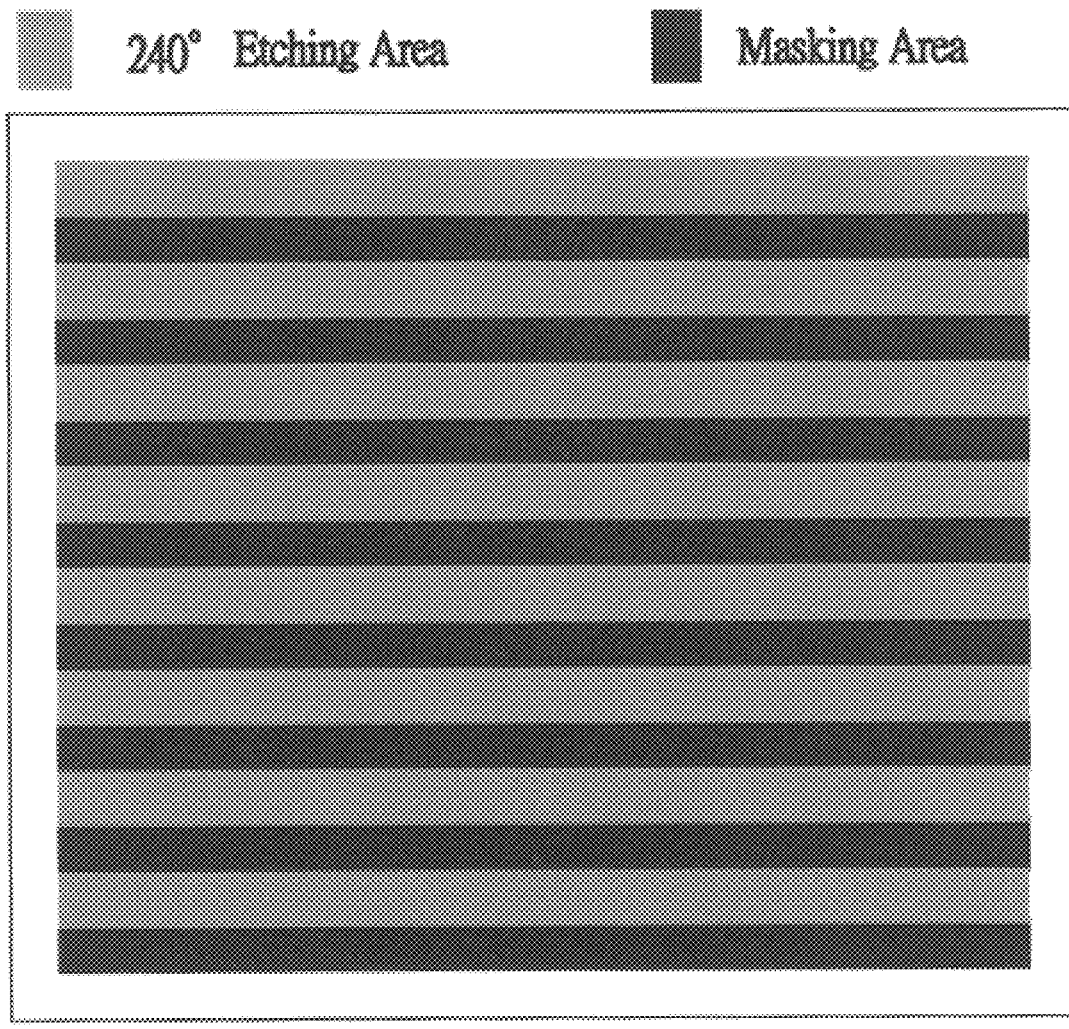
FIG. 11 shows a pattern of the second etching step.
Figure 12A:
FIG. 12A and FIG. 12B show a pattern as shown in FIG. 9 with a three-phase phase-shift characteristics by superposing the patterns shown as FIG. 10A and FIG. 10B with the pattern in FIG. 11, respectively.
Figure 12A:
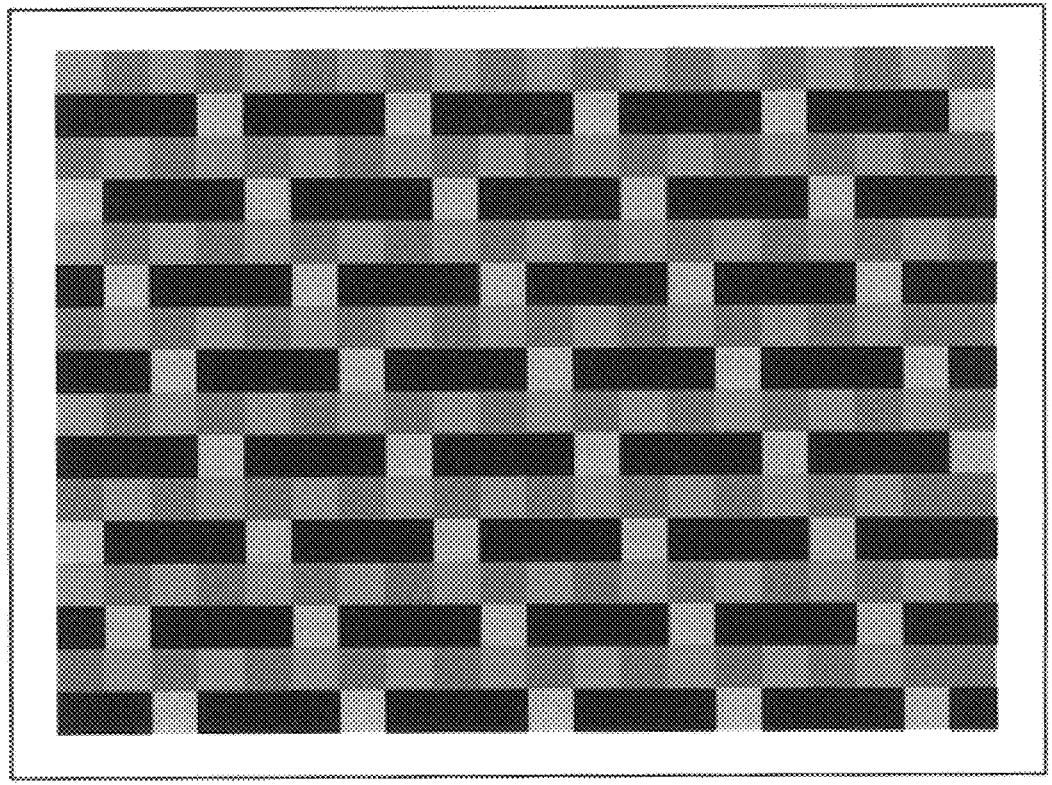
Figure 12B:
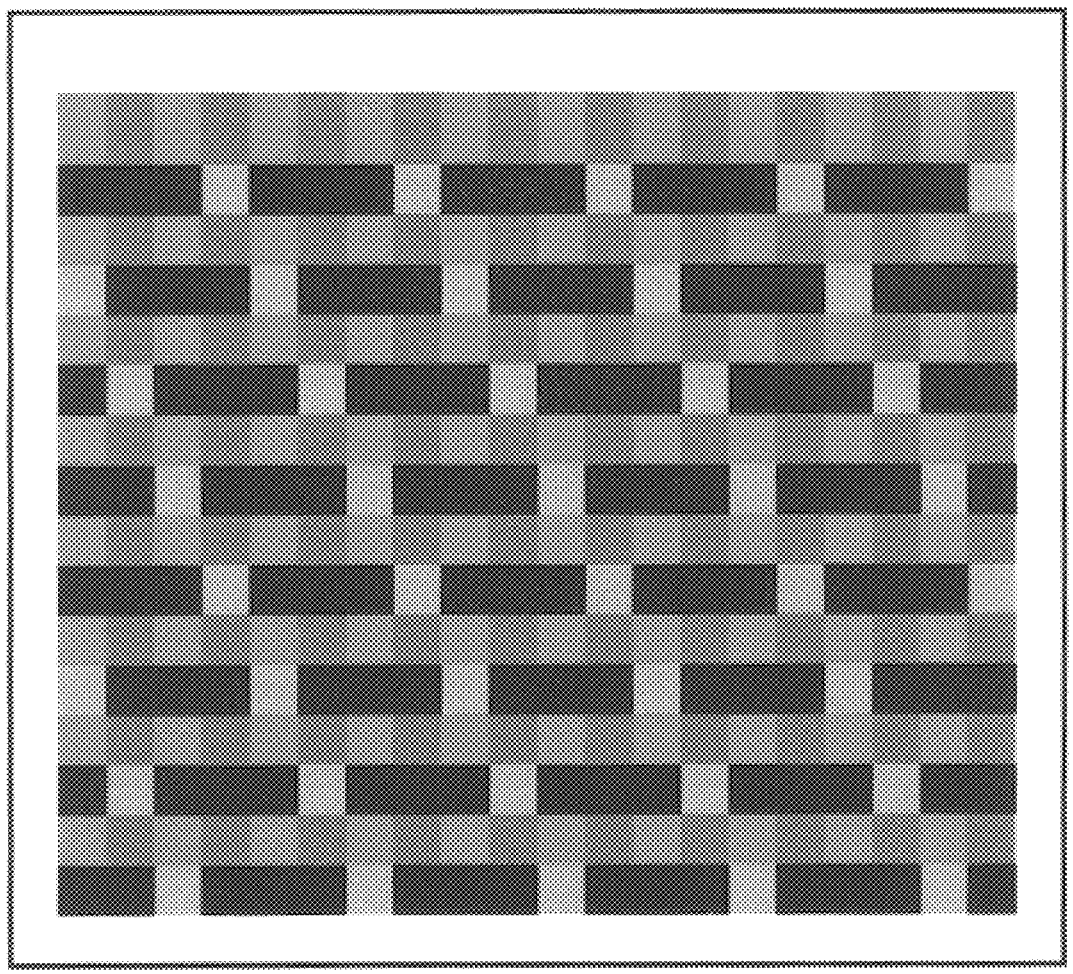

FIG. 9 shows a pattern with stagger rectangles to be formed. The arrangement of these rectangles is different from that shown in FIG. 4 and FIG. 5. Again, through two etching step, that is, to etch the transparent area of the photomask once with a first phase shift as shown in FIG. 10A and FIG. 10B, and to etch the transparent area with a second phase shift once as shown in FIG. 11. For those transparent areas etched twice with the first phase shift and the second phase shift thus have a third phase shift which is the sum of the first and the second phase shift. These three phase shift areas are in 120° phase different from each other. FIG. 12A and FIG. 12B are the resultant patterns by superposing FIG. 10A with FIG. 11 and FIG. 10B with FIG. 11, respectively.

Figure 13A:
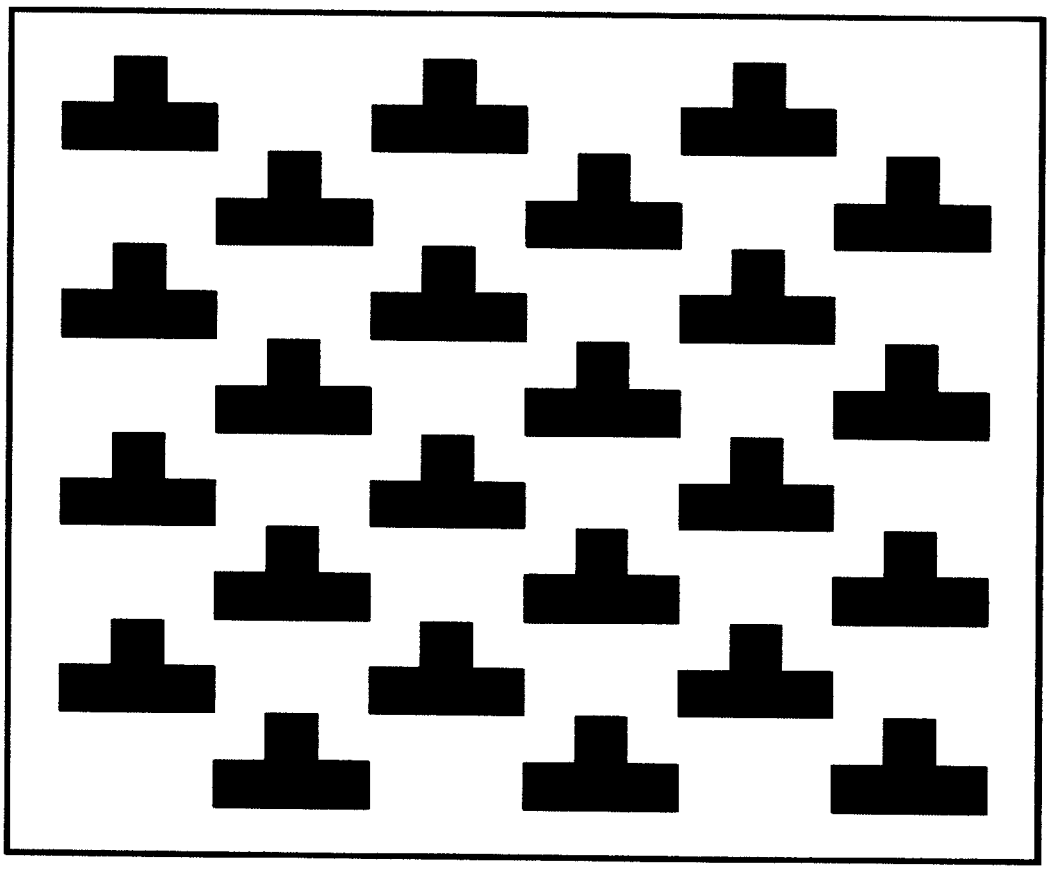
FIG. 13A shows a pattern to be formed on a photomask.
Figure 13B:
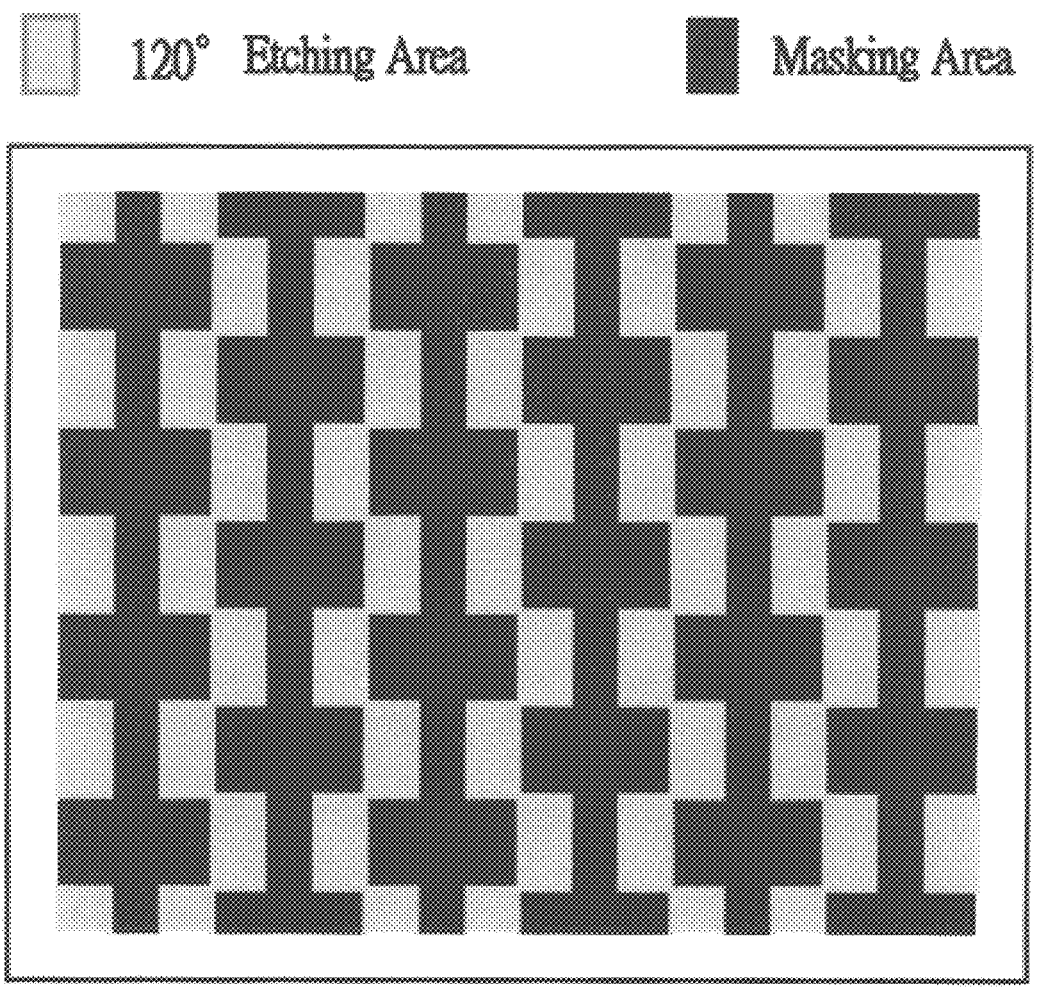
FIGS. 13B and 13C show patterns after two etching steps, respectively.
Figure 13C:
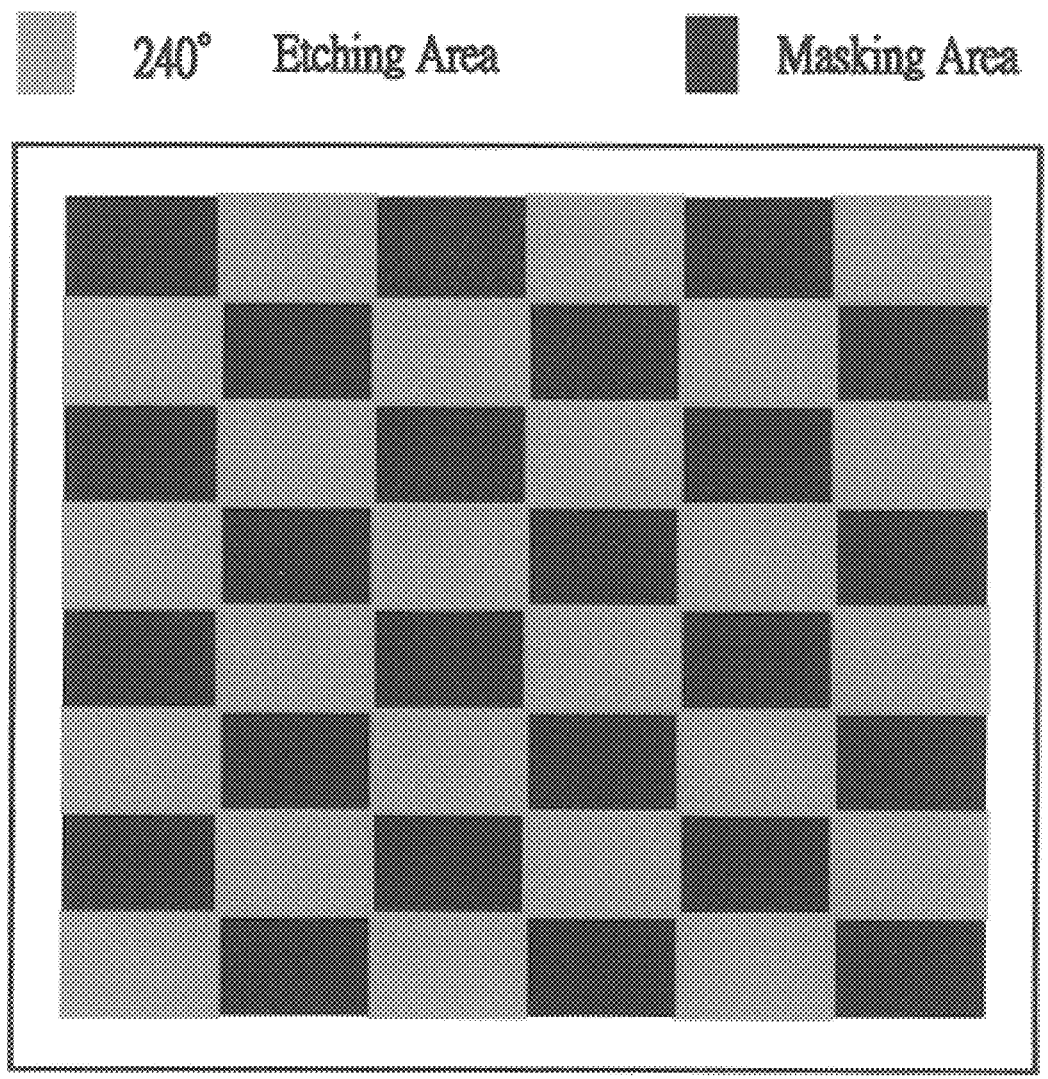
Figure 13D:
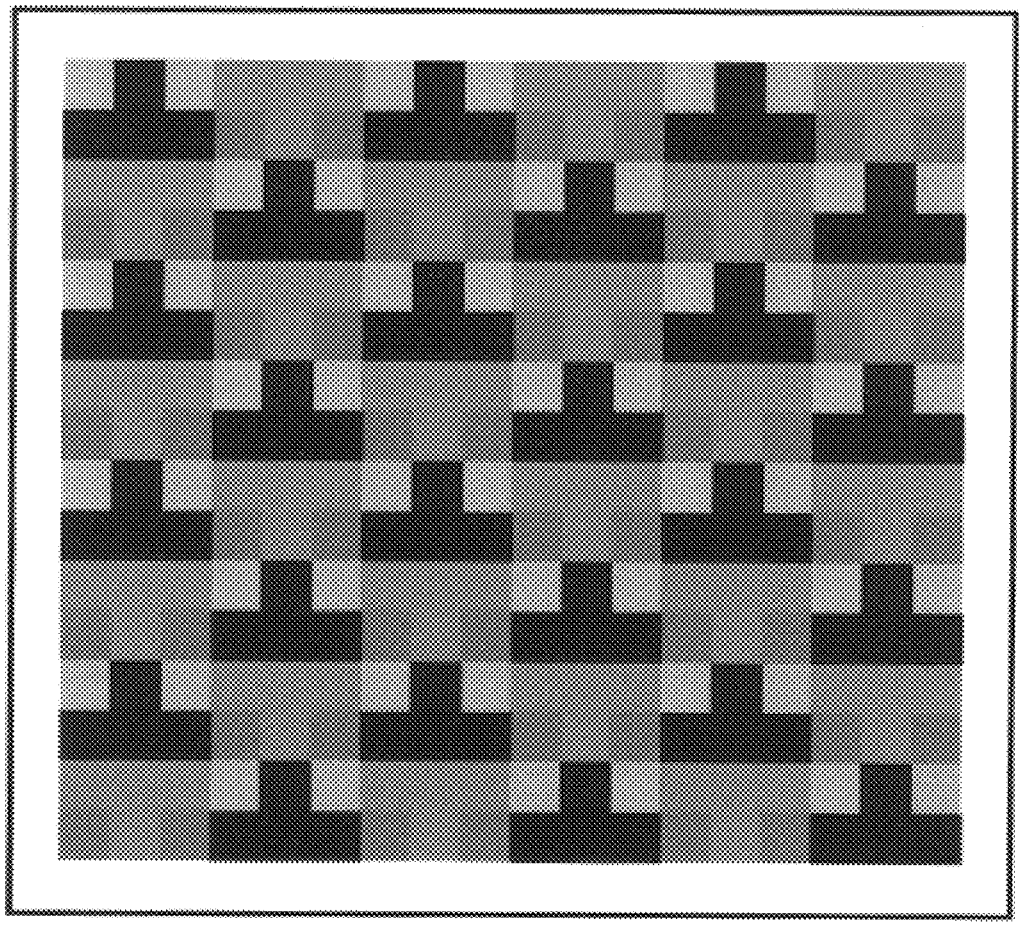
FIG. 13D shows the pattern as shown in FIG. 13A with a three-phase phase-shift characteristics by superposing the patterns shown as FIG. 13B and FIG. 13C.

Using the same method as above, the pattern in FIG. 13A can be formed. Furthermore, around each corner of the pattern as shown in FIG. 13A, the proximity region is equally partitioned into three phase-shift areas with a phase difference of 120° from each other. For example, FIG. 13D shows the resultant pattern of the three-phase phase-shift mask by superposing the pattern of FIG. 13B with the pattern of FIG. 13C.

From the above embodiment, the invention provides a three-phase phase-shift mask that cancels the light transmitting through the proximity region around each corner of the pattern. Thus, the deformation of the pattern, especially the rounding effect at each corner is eliminated without forming an additional assist feature thereon. Using the three-phase phase shift mask, the pattern can thus be transferred to the wafer with high fidelity. This is particularly applicable and advantageous for those patterns with a small critical dimension that does not have available space for forming assist features.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A three-phase shift mask, comprising:

a transparent substrate;

a non-transparent pattern, covering a first portion of the transparent substrate, while a second portion of the substrate remains transparent; and three phase-shift areas on the second portion, different from each other with a phase shift of 120°; where at any corner of the non-transparent pattern, a proximity region around the corner is equally partitioned by the three phase-shift areas.

2. The three-phase phase shift mask according to claim 1, wherein the corner has a degree of a°, so that the proximity region is equally partitioned into the three phase-shift areas each of which has an angle of (360°−a°)/3.

3. The three-phase phase shift mask according to claim 1, wherein the three phase-shift areas comprise a first phase-shift area with a phase shift of 120°, a second phase-shift area with a phase-shift 240°, and a third phase-shaft area with a phase shift of 360°.

4. The three-phase phase shift mask according to claim 1, wherein in the remaining transparent portion of the substrate apart from proximity region around the corner, phase edges are formed between two of the three phase-shift areas.

5. A method of fabricating a three-phase phase-shift mask, comprising:

providing a transparent substrate;

etching the transparent substrate with a first pattern to form a first phase shift area with a phase shift of 120° around the first pattern; and etching the transparent substrate with a second pattern to form a second phase shift area with a phase shift of 240° around the second pattern; wherein a portion of the transparent substrate that have been etched during both of the above two etching steps is a third phase shift area with a phase shift of 360°.

6. The method according to claim 5, wherein the first pattern and the second pattern are designed in a way that at any corner thereof, a proximity region is equally partitioned into the first, the second and the third phase shift areas.

7. The method according to claim 5, wherein the first pattern and the second pattern are designed in a way that only a proximity region of any corner of the first and the second patterns on the transparent substrate simultaneously has the first, the second and the third phase shift areas joining together, while other portions of the transparent substrate only has one or two of the first, the second and the third adjacent to each other.

8. A three-phase phase shift mask, comprising:

a transparent substrate;

a non-transparent pattern comprising at least a corner having an angle, the pattern covering a first portion the transparent substrate and a second portion of the transparent substrate exposed; and a first phase-shift area, a second phase-shift area, and a third phase-shift, equally partitioning a proximity region of the second portion around corner, the first, second and the third phase-shift areas have a phase difference of 120° from each other.

9. The three-phase phase shift mask according to claim 8, wherein the corner has a degree of a°, so that each of the first, the second, and the third phase-shift areas has an angle of $(360°-a°)/3$.

10. The three-phase phase shift mask according to claim 8, wherein the the first phase-shift area has a phase shift of 120°, the second phase-shift area has a phase shift of 240°, and a third phase-shift area has a phase shift of 360°.

11. The three-phase phase shift mask according to claim 8, wherein in the second portion of the transparent substrate apart from proximity, phase edges are formed between two of the first, second and third phase-shift areas.

* * * * *